United States Patent [19]

Ohsawa et al.

[11] Patent Number: 5,481,798

[45] Date of Patent: Jan. 9, 1996

[54] ETCHING METHOD FOR FORMING A LEAD FRAME

[75] Inventors: Kenji Ohsawa; Makoto Ito; Mutsumi Nagano, all of Kanagawa, Japan

[73] Assignee: Sony Corporation, Tokyo, Japan

[21] Appl. No.: 372,247

[22] Filed: Jan. 13, 1995

[30] Foreign Application Priority Data

Jan. 19, 1994 [JP] Japan ................................. 6-019948

[51] Int. Cl.⁶ ................................................ H01R 43/00
[52] U.S. Cl. ................................ 29/827; 29/884; 216/14
[58] Field of Search .......................... 29/827, DIG. 16, 29/884; 156/651.1, 652.1; 216/14, 77, 78; 257/673; 361/813

[56] References Cited

U.S. PATENT DOCUMENTS

| | | | |
|---|---|---|---|
| 3,773,628 | 11/1973 | Misawa et al. | 216/14 X |
| 4,511,429 | 4/1985 | Mizsutani et al. | 216/78 X |
| 4,878,990 | 11/1989 | Dugan et al. | 156/652.1 X |
| 5,221,428 | 6/1993 | Ohsawa et al. | 29/827 X |

*Primary Examiner*—Peter Vo
*Assistant Examiner*—Khan V. Nguyen
*Attorney, Agent, or Firm*—Hill, Steadman & Simpson

[57] ABSTRACT

A lead frame capable of easily connecting an inner lead to an electrode of a semiconductor element by way of a bump of the inner lead, and a method of manufacturing the lead frame capable of significantly easily forming the bump. A bump forming metal layer is formed on a metal base sheet on an area where each inner lead is to be formed. The inner lead is formed on the bump forming metal layer, and the bump forming metal layer is etched using the inner lead as a mask, thus forming a bump. After that, each outer lead is formed by selective etching of the metal base sheet from the rear surface side.

6 Claims, 4 Drawing Sheets

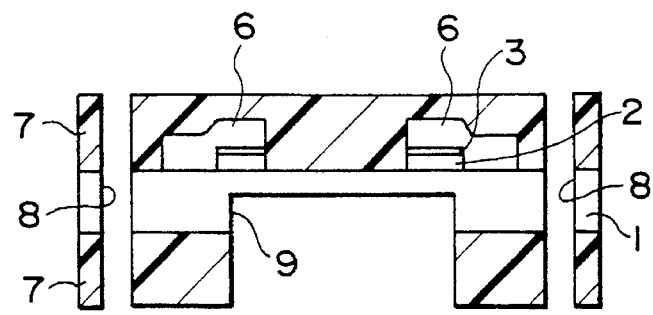
FIG. IF
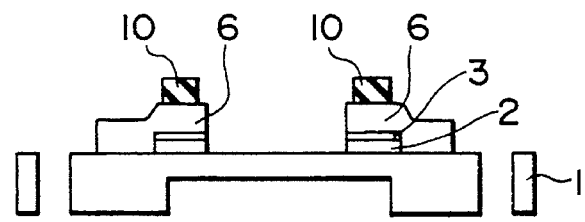
FIG. IG
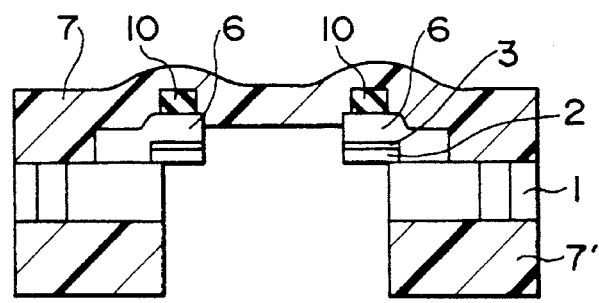
FIG. IH
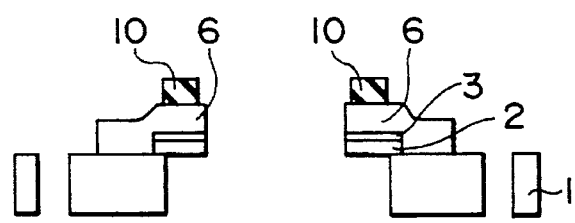
FIG. II

ETCHING METHOD FOR FORMING A LEAD FRAME

BACKGROUND OF THE INVENTION

1. Field of the Invention

The present invention relates to a lead frame, particularly, a lead frame capable of easily connecting an inner lead to an electrode of a semiconductor element by way of a bump of the inner lead; and a method of manufacturing the lead frame capable of easily forming the bump.

2. Description of the Related Art

Some lead frames have a structure that the inner end portion of the front surface of an outer lead made of copper is connected to the base end portion of the rear surface of an inner lead, by way of an intermediate layer made of aluminum which acts as an etching stopper in the etching for patterning the outer lead and the inner lead. In most of these lead frames, the leading edge portion of the inner lead has a bump made of aluminum, and is connected to an electrode pad of a semiconductor element by way of the bump.

The bump of the lead frame has been formed by a method wherein, for example, when the etching for patterning an inner lead and an outer lead is performed and thereafter an intermediate layer made of aluminum acting as an etching stopper in the above etching is etched using the inner lead and the outer lead as a mask, the portion where the bump is to be formed is also masked.

Such a lead frame, however, presents a problem in bonding of the leading edge of the inner lead to an electrode pad of a semiconductor element. When the position at which the leading edge of the inner lead is pressed by a bonding tool is slightly shifted from the bump position along the longitudinal direction of the inner lead, it becomes difficult to obtain good bonding.

Another problem occurs in a method of manufacturing such a lead frame. Namely, the formation of the bump additionally requires a series of photoresist selectively forming processes including the formation, exposure, development of a photoresist film, thus increasing the number of the processes.

Additionally, there occurs an inconvenience in shifting the forming position of the bump due to the deviation in the mask adjustment. The shifting of the forming position of the bump leads to the defective bonding.

OBJECTS AND SUMMARY OF THE INVENTION

An object of the present invention is to provide a lead frame capable of easily connecting an inner lead to an electrode of a semiconductor element by way of a bump of the inner lead.

Another object of the present invention is to provide a method of manufacturing the lead frame capable of significantly easily forming a bump.

To achieve the above objects, according to a first aspect of the present invention, there is provided a lead frame wherein the inner end portion of the front surface of each outer lead is connected to the base end portion of the rear surface of each inner lead by way of a metal layer made of a material different from that of the outer lead, the improvement wherein the metal layer extends on a rear side portion, of the inner lead, which projects from the outer lead, and forms a bump having the same planar shape as that of the inner lead.

In this lead frame, a bump forming metal layer exists over the rear side portion, of an inner lead, which projects from an outer lead. This eliminates a defective bonding which is caused when the portion of an inner lead where a bump is not formed is pressed by a bonding tool upon bonding of the leading edge of the inner lead to an electrode pad of a semiconductor element. The bonding is thus made easy and the percentage defective of bonding is made small.

To achieve the above objects, according to a second aspect of the present invention, there is provided a method of manufacturing a lead frame comprising the steps of:

forming a bump forming metal layer, which is made of a material different from that of each outer lead, on one surface of a metal base sheet for forming the outer lead, on an area where a group of inner leads are to be formed;

forming each inner lead, which is made of a metal different from that of the bump forming metal layer, on the bump forming metal layer;

etching the bump forming metal layer using the inner lead as a mask, thereby forming a bump, and forming the outer lead by selective etching of the metal base sheet from the rear surface side, and exposing the bump by etching.

In this method, a bump forming metal layer on the front surface of a metal base sheet forming an outer lead is etched using an inner lead formed on the bump forming metal layer as a mask, and thereby it can be formed on the rear surface of the inner lead in the same shape as that of the inner lead. Thus, when the outer lead is formed by selectively etching the metal base sheet from the rear surface side, the portion of the bump forming metal layer, which projects from the outer lead, becomes a bump.

The bump can be thus formed without any special patterning process.

According to the above method of manufacturing a lead frame, the etching of the bump forming metal layer using the inner lead as a mask is preferably dry etching.

In this method, since a bump forming metal layer is dry-etched using an inner lead as a mask, the patterning for the bump forming metal layer can be made without any side etching such that the bump forming metal layer is accurately formed into the same shape as that of the inner lead.

The above method of manufacturing a lead frame, preferably, further comprises the steps of:

forming a thin plating backing metal layer is formed on a bump forming metal layer made of aluminum;

forming a resist film, having a negative pattern against each inner lead to be formed on the plating backing metal layer, on the plating backing metal layer;

forming an inner lead forming metal layer on the plating backing metal layer using the resist film as a mask; and etching the plating backing metal layer using the inner lead forming metal layer as a mask, thereby forming each inner lead.

In this method, a resist film having a negative pattern against an inner lead is formed on a plating backing metal layer on a bump metal layer and a metal layer is plated on the plating backing metal layer using the resist film as a mask, thereby forming the inner lead. This eliminates an inconvenience that fine patterning to the inner lead is obstructed by side etching as in the patterning by selective etching. As a result, in this method, a fine inner lead can be formed. Moreover, since the thin copper layer (plating backing metal layer) on the bump forming metal layer is etched using the inner lead as a mask, there can be eliminated the short-circuit between the inner leads by the plating backing metal layer.

According to the above method of manufacturing a lead frame, the inner lead forming metal layer is preferably made of copper.

In this method, an inner lead made of copper can obtain high flexibility.

According to the above method of manufacturing a lead frame, the inner lead forming metal layer is preferably made of nickel.

In this method, since an inner lead has a double structure of nickel and copper, it is possible to ensure a suitable flexibility by copper and also ensure the strength of the inner lead depending on the high hardness of the upper layer of nickel, and to effectively prevent the corrosion of the inner lead upon etching the unnecessary portion of a bump forming metal layer using the inner lead as a mask.

According to the above method of manufacturing a lead frame, the inner lead forming metal layer preferably has a double structure of nickel and copper.

In this method, since an inner lead is made of nickel having a high hardness, it is possible to ensure the strength of the inner lead, and to prevent the corrosion of the inner lead upon etching the unnecessary portion of a bump forming metal layer using the inner lead as a mask.

BRIEF DESCRIPTION OF THE DRAWINGS

FIGS. 1A to 1I are sectional views showing an embodiment of a method of manufacturing a lead frame of the present invention in sequence of processes;

DETAILED DESCRIPTION OF THE PREFERRED EMBODIMENT

Hereinafter, a lead frame and a method of manufacturing the lead frame according to the present invention will be described in detail by way of an embodiment with reference to the drawings.

FIGS. 1A to 1I are sectional views showing an embodiment of a method of manufacturing a read frame of the present invention in sequence of processes; and FIGS. 2A to 2D are perspective view of the embodiment in sequence of processes.

The method of manufacturing the lead frame will be described with reference to FIG. 1.

Figure 1A:
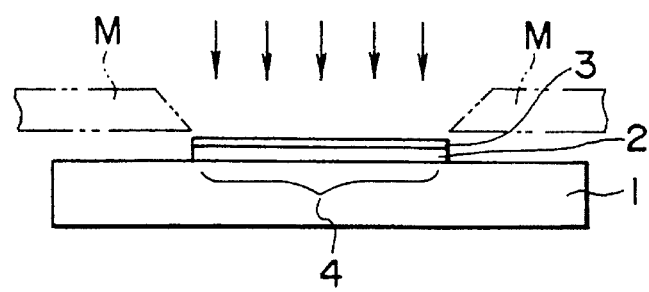

As shown in FIG. 1A, there is first prepared a metal base sheet (lead frame base) 1 which is to be formed into outer leads. A bump forming metal layer 2 (thickness: for example 0.1 to 10 μm) made of for example aluminum is formed using a mask M on the front surface of the metal base sheet 1 on an area where a group of inner leads are to be formed. A thin metal layer 3 as plating backing, which is made of copper or nickel, is formed on the bump forming metal layer 2 to a thickness of about 0.1 to 1 μm. The thin metal layer 3 acts to strengthen the bonding force between each inner lead 6 and the bump forming metal layer 2 when the inner lead 6 is formed by plating on the bump forming metal layer 2 later.

Figure 2A:
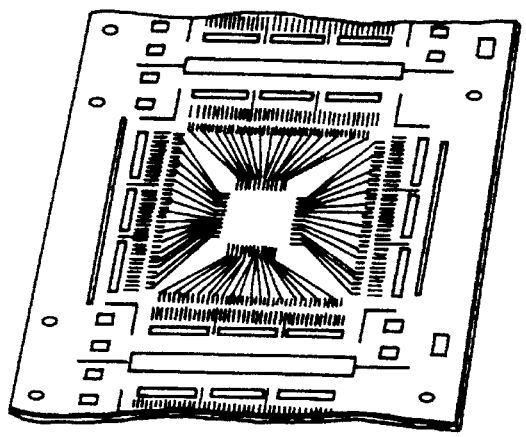
FIGS. 2A to 2D are perspective views showing the above embodiment in sequence of processes.

The metal base sheet 1 is made of a Cu alloy "TAMAC-15 (Mitsubishi Shindoh, Co., Ltd)" or 42 alloy and has a thickness of 0.08 to 0.2 mm. FIG. 2A shows the state after the thin metal layer 3 is formed.

Figure 1B:
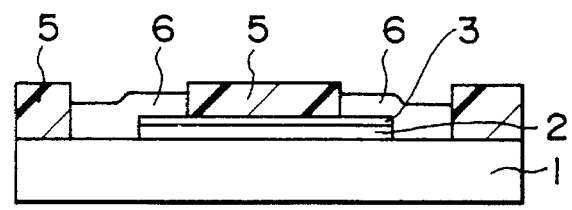

As shown in FIG. 1B, a resist film 5 (thickness: for example, 20 μm) is selectively formed on the front surface of the metal base sheet 1. A metal layer 6 is then formed on the metal base sheet 1 including the surface of the plating backing metal layer 3 using the resist film 5 as a mask. The metal layer 6 becomes a group of inner leads. The metal layer 6 has a double structure in which a nickel or nickel alloy layer having a thickness of for example 1 to 10 μm is laminated on the copper layer having a thickness of for example 5 to 25 μm.

The reason why the inner lead 6 has the double structure having a nickel or nickel alloy layer on the front surface side and a copper layer on the rear surface side lies in: ensuring the strength of the inner lead by the nickel or nickel alloy layer and preventing the corrosion of the inner lead itself by the etching which is performed later against the bump forming metal layer 2 using the inner lead as a mask; and ensuring the flexibility of the inner lead itself by copper for preventing the fracture thereof by an external force, and relaxing a damage given to an IC pad upon bonding between the IC pad and the inner lead.

The inner lead 6 may be formed of only a copper layer having a thickness of for example 10 to 20 μm. The flexibility of the inner lead itself can be thus significantly increased for effectively preventing the fracture thereof by an external force, and a damage given to an IC pad upon bonding between the IC pad and the inner lead can be effectively relaxed. In this case, there is a fear that the surface of the inner lead 6 itself is slightly corroded by the etching which is performed later against the bump forming metal layer 2; however, this problem can be solved by adding a corrosion allowance to the plating thickness of the inner lead 6.

The inner lead 6 may be made of only a nickel or nickel alloy layer having a thickness of for example 10 to 20 μm. In this case, the strength of the inner lead 6 can be enhanced.

Figure 1C:
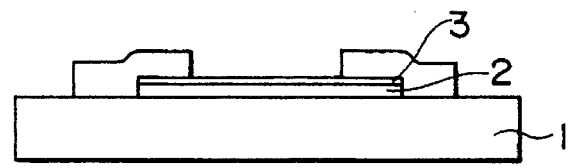

As shown in FIG. 1C, the resist film 5 is removed by dipping the lead frame, for example in NaOH 5% solution (40° C.) for 60 sec.

Figure 1D:
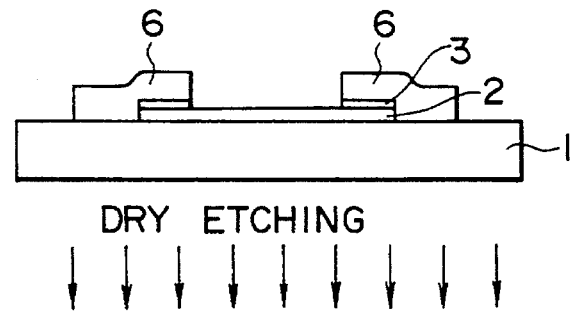

Next, as shown in FIG. 1D, the metal layer 3 made of for example copper as plating backing on the bump forming metal layer 2 is removed by etching using the inner lead 6 as a mask. The copper layer 3 has a thickness of for example about 0.3 μm, and it can be etched by the so-called quick etching, that is, by dipping the lead frame in an etching solution, ($H_2O_2+H_2SO_4+H_2O$), for several or several tens sec (for example, 10 sec).

The unnecessary portion of the thin metal layer 3 can be thus removed by this etching, to thereby eliminate the possibility of the short-circuit between the inner leads 6 and 6 by way of the thin metal layer 3.

Figure 1E:
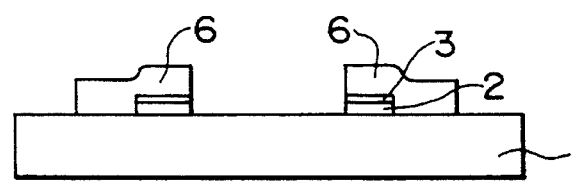
Figure 2B:
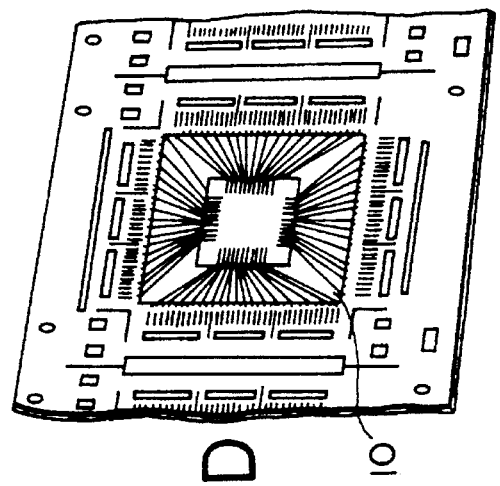

The bump forming metal layer 2 is dry-etched using the inner lead 6 as a mask as shown in FIG. 1E. Thus, the bump forming metal layer 2 is laminated at least on the leading edge portion of the inner lead 6 in such a manner as to be perfectly formed in the same shape as that of the leading edge portion of the inner lead 6. This is because the dry etching process does not generate any side etching. FIG. 2B shows the state after this dry etching.

The dry etching is performed, using for example a dry etching apparatus (HIRRIE-200) sold by SHIBAURA ENG WORKS, under the condition (for example, output: 350 W, flow rate of $Cl_2$: 60 SCCM, flow rate of $BCl_3$: 40 SCCM, pressure: 130 PA, and etching time: 5 min).

As shown in FIG. 1F, the front and rear surfaces of the metal base sheet 1 are selectively masked by an electrodeposition resist film 7, and in such a state, the metal base sheet 1 is etched from the front and rear surface sides to a depth equivalent to the half of the thickness of the metal base sheet 1. Specifically, the electrodeposition resist film 7 is formed on the front surface side of the metal base sheet 1 so as to cover the whole surface except for the portion where a hole 8 used for positioning or the like is to be formed, and it is formed on the rear surface side so as to cover the whole surface except for the portions where the hole 8 and a device hole 9 are to be formed; and in such a state, etching is made using for example an etchant of ferric chloride.

The hole 8 is thus perfectly formed, and the device hole 9 having a depth equivalent to the half of the thickness of the metal base sheet 1 is formed.

Figure 2C:
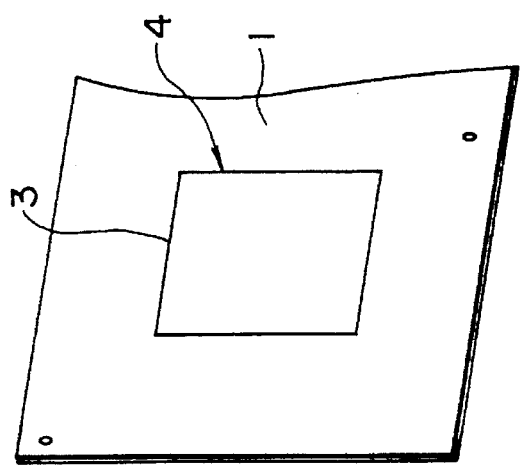

FIG. 2C shows the state after the etching.

Figure 2D:
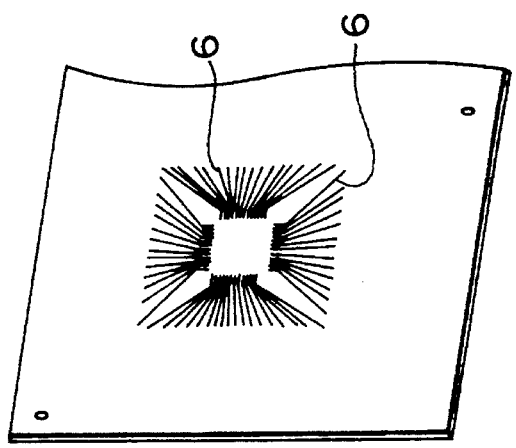

The electrodeposition resist film 7 is then removed, and thereafter, as shown in FIG. 1G, a rectangular frame like inner lead reinforcing polyimide tape 10 is laminated on each inner lead. For example, "Uplex" (polyimide tape, trade name) having a thickness of 125 μm is bonded on each inner lead using an epoxy resin adhesive having a thickness of 20 μm. FIG. 2D shows the state after lamination of the polyimide tape.

Next, as shown in FIG. 1H, the whole front surface of the metal base sheet 1 is masked by a resist film 7'; and the rear surface of the metal base sheet 1 is selectively masked by the resist film 7'. The selective masking is performed to cover the whole rear surface except for the device hole 9. In such a state, the rear surface of the metal base sheet 1 is etched using a hydrogen peroxide or nitric acid based etching solution, so that the device hole 9 is perfectly formed. Each inner lead 6 having the bump forming metal layer 2 on the lower surface is thus perfectly exposed, and the bump forming metal layer 2 existing on the lower surface of each inner lead 6 becomes a bump.

Figure 3:
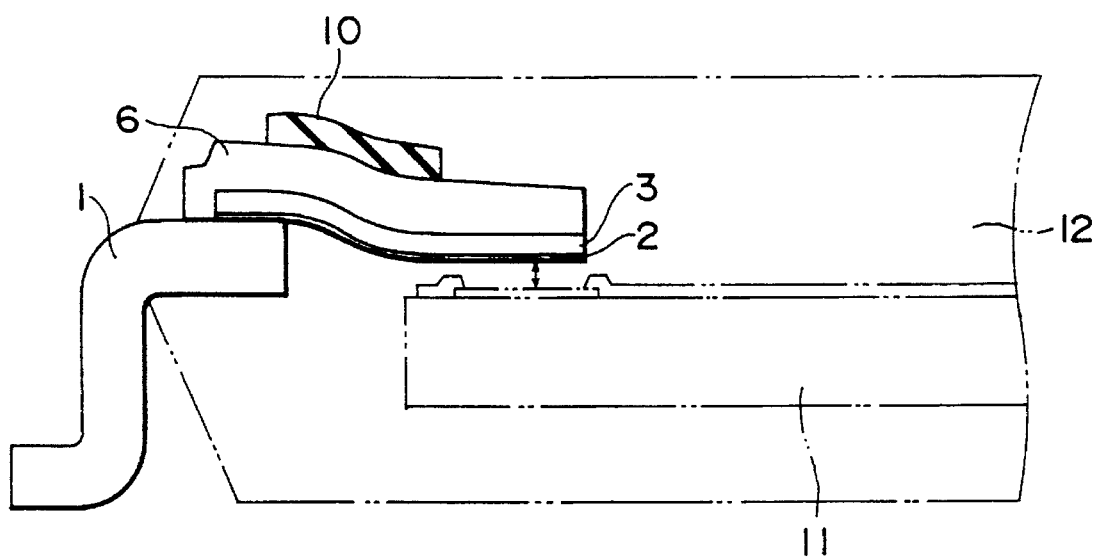
FIGS. 3 is an enlarged sectional view showing one embodiment of a lead frame of the present invention manufactured by the manufacturing method shown in FIGS. 1A to 1I and FIGS. 2A to 2D.

After that, as shown in FIG. 1I, the resist film 7' is removed, thus forming the lead frame as shown in FIG. 3. In FIG. 3, reference numeral 11 shown by the two-dot chain line designates an IC, and 12 designates a resin package.

Namely, in this lead frame, the metal layer 2 interposed between the inner end portion of the front surface of the outer lead 1 and the base end portion of the rear surface of the inner lead 6, extends up to the rear surface portion of the inner lead 6, the rear surface portion projecting from the outer lead, and it forms the bump having the same planar shape as that of the lead frame 6.

The bump 2 is formed over the whole rear surface portion, of the inner lead 6, which projects from the outer lead 1; accordingly, there can be eliminated the following inconvenience. In a conventional lead frame, when an inner lead is bonded to an electrode of a semiconductor element, the portion of the inner lead where a bump is not formed is pressed by a bonding tool, which leads to a bonding failure. The lead frame of the present invention, therefore, makes easy the bonding and reduces the percentage defective of bonding.

According to the method of manufacturing the lead frame as shown in FIGS. 1A to 1I, the bump forming metal layer 2 on the front surface of the metal base sheet 1 forming the outer lead is etched using the inner lead 6 formed on the bump forming metal layer 2 as a mask, so that it is formed on the rear surface of the inner lead 6 in the same shape as that of the inner lead 6. Thus, when the outer lead is formed by selectively etching the metal base sheet 1 from the rear surface side, the portion of the bump forming metal layer 2, which projects from the outer lead 1, becomes a bump.

Accordingly, the bump can be formed without any special patterning process.

What is claimed is:

1. A method of manufacturing a lead frame comprising the steps of:

forming a bump forming metal layer on one surface of a metal base sheet on an area where a group of inner leads are to be formed; wherein the base sheet is made of a material different from the bump forming metal layer and is adapted to form outer leads;

forming each inner lead, which is made of a metal different from that of said bump forming metal layer, on said bump forming metal layer, so that each inner lead contacts said bump forming metal layer and said base sheet;

etching said bump forming metal layer using said inner lead as a mask, thereby forming a bump, and forming said outer leads by selective etching of said metal base sheet from a side opposite said bump, and exposing said bump by etching.

2. A method of manufacturing a lead frame according to claim 1, wherein the etching of said bump forming metal layer using said inner lead as a mask is dry etching.

3. A method of manufacturing a lead frame comprising the steps of:

forming a bump forming metal layer on one surface of a metal base sheet on an area where a group of inner leads are to be formed; wherein the base sheet is made of a material different from the bump forming metal layer and is adapted to form outer leads;

forming a thin aluminum plating backing metal layer on said bump forming metal layer;

forming a resist film, having a negative pattern against each inner lead to be formed on said plating backing metal layer, on said plating backing metal layer;

forming an inner lead forming metal layer on said plating backing metal layer using said resist film as a mask, said inner lead forming being made of metal different from that of said bump forming metal layer;

etching said plating backing metal layer using said inner lead forming metal layer as a mask, thereby forming each inner lead;

etching said bump forming metal layer using said inner lead as a mask, thereby forming a bump, and forming said outer leads by selective etching of said metal base sheet from a side opposite said bump, and exposing said bump by etching.

4. A method of manufacturing a lead frame according to claim 3, wherein said inner lead forming metal layer is made of copper.

5. A method of manufacturing a lead frame according to claim 3, wherein said inner lead forming metal layer is made of nickel.

6. A method of manufacturing a lead frame according to claim 3, wherein said inner lead forming metal layer has a double structure of nickel and copper.

* * * * *